(12) United States Patent
Hrubes et al.

(10) Patent No.: US 7,092,833 B2
(45) Date of Patent: Aug. 15, 2006

(54) METHOD AND CIRCUIT FOR LINEARIZING NONLINEAR CURVES

(75) Inventors: Franz Hrubes, Rotthalmünster (DE); Karl Wisspeintner, Ortenburg (DE)

(73) Assignee: Micro-Epsilon Messtechnik GmbH & Co. KG, Ortenburg (DE)

( * ) Notice: Subject to any disclaimer, the term of this patent is extended or adjusted under 35 U.S.C. 154(b) by 0 days.

(21) Appl. No.: 10/682,500

(22) Filed: Oct. 9, 2003

(65) Prior Publication Data
US 2004/0070527 A1 Apr. 15, 2004

Related U.S. Application Data

(63) Continuation of application No. PCT/DE02/01246, filed on Apr. 5, 2002.

(30) Foreign Application Priority Data

| Apr. 10, 2001 | (DE) | ............................ 101 18 000 |
| Mar. 20, 2002 | (DE) | ............................ 102 12 461 |

(51) Int. Cl.
*G06F 19/00* (2006.01)
*G06F 17/00* (2006.01)
*H03F 1/26* (2006.01)

(52) U.S. Cl. .................. 702/86; 73/335.05; 330/149; 374/173; 702/104

(58) Field of Classification Search ............ 702/85–86, 702/99, 104, 105–107; 73/335.05; 374/173; 330/149

See application file for complete search history.

(56) References Cited

U.S. PATENT DOCUMENTS

| 3,926,052 | A | * | 12/1975 | Bechtel | .................... 73/335.05 |
| 4,148,220 | A | * | 4/1979 | Spofford | ..................... 374/173 |
| 4,581,714 | A | * | 4/1986 | Reid | ......................... 702/86 |
| 4,873,655 | A | | 10/1989 | Kondraske | |
| 5,675,288 | A | * | 10/1997 | Peyrotte et al. | ............. 330/149 |
| 5,848,383 | A | | 12/1998 | Yunus | |

FOREIGN PATENT DOCUMENTS

| DE | 26 16 224 A1 | 10/1976 |
| DE | 25 44 591 A1 | 4/1977 |
| DE | 39 40 376 C1 | 12/1990 |
| DE | 44 01 525 A1 | 7/1995 |

* cited by examiner

*Primary Examiner*—Bryan Bui
*Assistant Examiner*—John H. Le
(74) *Attorney, Agent, or Firm*—Alston & Bird LLP

(57) ABSTRACT

A method for linearizing a nonlinear curve with a linearization circuit (1), wherein the curve represents the relationship between input signals and output signals of a sensor. An output signal (100, 110, 120) of the sensor, which is respectively associated with an input signal, is displayed with respect to a simple and cost favorable linearization such that the adjustment of the linearization circuit (1) essentially occurs in an automated way utilizing sequence controller (2). A corresponding circuit is also described for practicing the method.

39 Claims, 3 Drawing Sheets

METHOD AND CIRCUIT FOR LINEARIZING NONLINEAR CURVES

CROSS REFERENCE TO RELATED APPLICATION

The present application is a continuation of international application PCT/DE02/01246, filed 5 Apr. 2002, and which designates the U.S. The disclosure of the referenced application is incorporated herein by reference.

BACKGROUND OF THE INVENTION

The invention relates to a method and a circuit arrangement for linearizing nonlinear curves with a linearization circuit, wherein the curve represents the relationship between input signals and output signals of a component, in particular a sensor, and wherein an output signal is associated with each input signal.

Methods and circuits for linearizing nonlinear curves have been known in practical operation for a long time, because components frequently supply no linear relationship between the input signal and the output signal. This applies in particular to sensors, in which a nonlinear connection exists in general between the physical quantity being measured, i.e., the input signal of the sensor, and the change of the electrical signal, which the sensor in use for the measurement supplies as an output signal. In most cases, nonlinear, constantly rising or constantly decaying signals, normally voltages and/or currents develop above the measured value.

The potentials of existing A/D converters—analog-digital converters—and of D/A converters—digital-analog converters—and the use of microprocessors permit a relatively simple, mathematical linearization of curves, when the curve shape is exactly known. As an alternative thereto, it is also possible to use a microprocessor for performing a mathematical linearization with few reference values and a given basic formula.

However, these methods are problematic in that noticeable limitations exist with respect to the resolution and the speed of the linearization. If the curve is strongly bent, it will require a correspondingly high resolution of the A/D converter. Precision A/D converters of this type with a resolution of more than 16 bits are relatively expensive. Furthermore, the price of such precision A/D converters considerably increases along with the processing speed of the A/D converter. If a signal with a resolution of 17 bits or higher is to be processed with a simultaneously high signal frequency, i.e., as high as 200 kHz and higher, currently available A/D converters will make this possible at extremely high costs or in part not at all.

As an alternative, it has been common for a long time to linearize with analog linearization circuits, since analog components permit realizing a high resolution and accuracy at a high processing speed at the same time. However, this method is problematic in that the adjustment of the linearization circuit requires an accurate adjustment of the operating points of the linearization circuit, which is possible only by a manual, iterative adjustment, i.e., by often repeatedly inputting different input signals that are distributed over the measuring range, with respectively combined adjustments of potentiometers for the zero point, the amplification, and the smallest linearity deviation of the linearized curve. This procedure may take a very long time, in particular for unskilled and inexperienced operators, and may even fail in the event of a wrong manipulation. In addition, it is possible only with difficulties, or in part not possible at all to adjust over and over again exactly the same physical input signals in each adjustment step, for example, the distance of a sensor from an object of measurement. As a result, the required amount of adjustments increases accordingly to a great extent.

It is therefore an object of the present invention to provide a method as well as a circuit of the initially described type for linearizing nonlinear curves, which permit a simple and cost-favorable linearization.

SUMMARY OF THE INVENTION

In accordance with the invention, the foregoing object is accomplished by a method and a circuit for linearizing nonlinear curves wherein the adjustment of the linearization circuit essentially occurs in an automated way by means of a sequence controller.

In accordance with the invention, it has been found that the adjustment of the linearization circuit in an essentially automated way by means of a sequence controller achieves an especially satisfactory resolution with a high accuracy and at a high processing speed, as is possible in an analog linearization circuit. High costs as are incurred for very precise A/D or D/A converters are absent in the present invention. In addition, the sequence controller permits an essentially automated adjustment of the curve. The adjustment is now no longer dependent on the skill of the operator, and therefore no longer so time-consuming, or it can no longer fail. The method of the invention therefore combines the advantages of the known methods, and this without having their disadvantages.

In a particularly advantageous manner, it would be possible to acquire and/or store at least one output signal, actual input value, by means of the sequence controller. Accordingly, the actual input value corresponds to the output signal of the circuit component. This would be advantageous, in particular to the end that one would have to adjust the input signals that generate the output signal, only once, for example, in the case of a displacement sensor, the smallest measuring distance, the average measuring distance, or the maximum measuring distance. As a result, any further need for an exact readjustment of the input signals or measuring distances will be eliminated during an adjustment of the linearization circuit.

Alternatively, one could enter into the sequence controller at least one reference input value, preferably via an input unit. The input unit could be, for example, a keyboard or the like. This would be of special advantage, when both the input signal of the component, for example, the smallest, the average, or the maximum measuring distance, and the output signal of the component, or the actual input value are known in the case of these measuring distances. The reference input value would then be selected equal to the output signal. However, the reference input value could also be generated by the sequence controller, for example, while taking into account the respective output signal of the component.

In an especially advantageous manner, the reference input value could be analogized for a comparison with the actual input value and a subsequent adjustment to the reference input value. As regards a particularly simple realization, it would be possible to analogize the reference input value by means of a D/A converter. The D/A converter could be a D/A converter with a high resolution, but would not need to be particularly stable, and it may be slow. In the alternative, it would be possible to analogize the reference input value by means of at least one adjustable signal source. This would be a particularly cost-favorable alternative, since one will need no costly D/A converter for a conversion to analog form.

Within the scope of a particularly simple development, it would be possible to form the signal source by at least one reference voltage and/or at least one, preferably digitally activatable potentiometer. In a particularly advantageous manner, the potentiometer could be adjusted in equidistant steps by means of the sequence controller.

In a further advantageous manner, the reference input value could be adjusted by means of three, preferably digitally activatable potentiometers. The output signals of the potentiometers could then be added by means of a summator. One of the potentiometers could be used for an initial coarse adjustment, the second potentiometer for a fine adjustment, and the third potentiometer for a final sensitive adjustment. In this connection, the adjustment range of the potentiometer for the fine adjustment could correspond to a step of the potentiometer of the coarse adjustment, and the adjustment range of the potentiometer for the sensitive adjustment to a step of the potentiometer for the fine adjustment.

With the use of digitally activatable potentiometers with, for example, 64 selectable, equidistant steps, i.e., with 6 bits, the potentiometer for the coarse adjustment could supply, for example, 0 to 10 volts in 64 steps @ 156.25 mV. The potentiometer for the fine adjustment could then supply a voltage from 0 to 157 mV in 64 steps @ 2.45 mV, and the potentiometer for the finest adjustment could supply a voltage from 0 to 2.45 mV in 64 steps. With that, one would obtain a finest resolution at 0.0383 mV. When related to the 10-volt range, this would correspond to a resolution of about 1:260,000, and thus to 18 bits. The output signals of the digital potentiometers could be added by means of the summator and, thus, result in the reference input value. The digital value of the reference input value that is to be stored, would result from the individual settings of the digital potentiometers, which corresponds to 3×6 bits. Furthermore, it would be possible to obtain in this manner a still greater resolution by further digital potentiometers or by digital potentiometers with more steps. For example, one could save one potentiometer at 1024 and 256 steps.

The described, especially advantageous development of a stepped signal adjustment of the reference input value with exactly identically sized steps, however, is problematic in that the component tolerances are often too great. It is therefore necessary to realize certain overlaps of the subranges, so that it is always ensured that an entire step is also indeed covered during the adjustment. Since the method of the invention does not require an exact measuring value, but only a comparison voltage—reference input value—which is essentially equal to the actual input value, such tolerances that correspond only to linearity and accuracy errors are insignificant as long as the required resolution is given.

As regards a particularly simple adjustment, it would be possible to store the settings of the potentiometers, in particular in combination with the associated reference input value and/or a reference output value. Likewise, it would be possible to store the settings in combination with the actual input value, so that the settings can be retrieved in connection with the different values.

With respect to a particularly accurate and simple adjustment, the actual input values and/or the reference input values could be applied to a comparing component, preferably a comparator. It would then be possible to compare the reference input value with the actual input value by means of the comparing component.

As regards a particularly simple development, the sequence controller could adjust the reference input value by iteration, until a predetermined deviation is undershot between the actual input value and the reference input value. With that, the present method would permit both a D/A conversion and an A/D conversion of signals, i.e., of the output signal of the component or sensor, in a very cost-favorable manner, since by retrieving the stored adjustment values, the output of the D/A converter or summator produces again the same signal that corresponds to the respective output signal of the component. Basically, it would thus be possible to store and retrieve as many output signals—voltages or currents—as desired, without having to readjust the component itself to the same value, for example, the same measuring distance. Within a certain range, this would make it possible to convert both a digital signal to an analog signal and an analog signal to a digital signal. In a particularly advantageous manner, one would need for the linearization only three stored output signals or pairs of reference input/reference output values.

In a particularly advantageous manner, one could select the reference input values as starting point, and/or as midpoint, and/or as end point of the linearized curve. This could correspond, for example to the smallest, or the average, or the maximum measuring distance of the sensor from an object of measurement. As an alternative thereto, one could select the reference input values from a subrange of input signals of the nonlinear curve. This would be of advantage, in particular when only subranges of the curve are to be linearized, since only the measurements in this range are of interest.

The reference input values that are output by the sequence controller, could be applied, preferably via a switch, to the input of the linearization circuit. The switch could be a switch that is controllable by the sequence controller, and which alternates in applying to the linearization circuit the reference input value that is output by the sequence controller, or the output signal of the component. Accordingly, the output signal of the component also corresponds to the actual input value of the linearization circuit.

With respect to yet again a very simple development, one could use the sequence controller to acquire and/or store at least one reference output value that is associated with the actual input value. In this instance, the reference output value could correspond to the output signal of the component in the working points, which are at the same time the support points of the linearized curve, i.e., for the paired values, in the case of which the nonlinear curve is equal to the linearized curve. The acquisition and/or storage of the reference output value could essentially occur at the same time as the acquisition or storage of the associated actual input value.

Within the scope of yet again a particularly simple development, a reference output value could be adjusted by means of reference signal sources. These reference signal sources could supply the reference output values, when same are exactly known. They could be, for example, the start of the measuring range, the midpoint of the measuring range, and the end of the measuring range, namely 0 volt, 5 volts, and 10 volts respectively. In accordance with the applied reference input value, it would then be possible to offer the individual reference output values by means of a switch that is controllable by the sequence controller. As an alternative thereto, the reference signal sources could be adjustable, when it is possible to adjust the start of the measuring range, the midpoint of the measuring range, and the end of the measuring range not exactly, but approximately, while the actual values are known and, thus, likewise the corresponding reference output values. A reference output value associated with the reference input value could be entered into the sequence controller, for example, via an input unit. This would be of special advantage, when the reference output value is known.

With respect to yet again a very simple development, the reference input values could be analogized by means of a D/A converter. The D/A converter could have a low resolution and little accuracy, for example, 13 to 14 bits. For this reason, the D/A converter would cause no great expense.

With respect to a particularly satisfactory linearization, it would be possible to use a comparing component, in particular a comparator, for comparing with the reference output values, the actual output values that are produced by the linearization circuit in response to the reference input values. The sequence controller could then evaluate the output signal of the comparing component. It would then be possible to use the sequence controller for adjusting at least one adjusting device. The adjusting devices are used for adjusting the linearization circuit, i.e., for adjusting the linearized curve.

Within the scope of a particularly simple linearization, at least one adjusting device could be used for a zero adjustment, and/or at least one adjusting device for adjusting the linearity, and/or at least one adjusting device for adjusting the slope of the linearized curve. As regards a particularly simple adjustment of the linearization circuit, the sequence controller could activate the adjusting devices with digital pulses.

For adjusting the linearization circuit, the sequence controller could now perform an adjustment of the linearization circuit for each pair of reference input/reference output values by means of the adjusting devices, until a predetermined deviation is undershot between the actual output value and the reference output value.

In a particularly advantageous manner, one could begin with adjusting for a first pair of reference input/reference output values, the adjusting device for adjusting the zero point for the linearized curve in such a manner that the actual output value is essentially equal to the reference output value.

Furthermore, it would then be possible to apply to the linearization circuit a further reference input value that is output by the sequence controller. Essentially at the same time, it would be possible to apply to the comparing component the associated reference output value produced by the sequence controller.

Now, it would again be possible to apply to the comparing component the actual output value of the linearization circuit of the further pair of reference input/reference output values. The output signal of the comparing component could again be evaluated by the sequence controller.

Based on the evaluation of the output signal of the comparing component, one could now adjust the adjusting device for adjusting the slope of the linearized curve such that the actual output value is essentially equal to the reference output value.

For a further adjustment of the linearization circuit it would now be possible to apply to the linearization circuit a further reference input value that is output by the sequence controller. Essentially at the same time, the associated reference output value as supplied by the sequence controller could be applied to the comparing component. For an adjustment, it would then be possible to apply to the comparing component the actual output value of the further pair of reference input/reference output values.

In a particularly advantageous manner, the output signal of the comparing component could again be evaluated by the sequence controller. After this evaluation, the adjusting device for adjusting the linearity of the curve could be adjusted such that the actual output value is essentially equal to the reference output value. Based on the evaluation of the output signal of the comparing component by the sequence controller, this would occur by means of the sequence controller. With that, a first adjustment of the linearization circuit would be completed. As an alternative thereto, however, it would also be possible to perform the adjustment such that initially, an adjustment of all adjusting devices occurs for the first pair of reference input/reference output values, and then an adjustment of all adjusting devices for the further pairs of reference input/reference output values.

As regards a particularly advantageous development, one could now repeat for a complete adjustment of the linearization circuit, the adjustment of the adjusting devices for the paired reference input/reference output values, until a predetermined deviation between the actual output value and the reference output value is undershot for all reference output values.

Within the scope of a particularly universal development, the sequence controller could store different linearized curves. These different curves could have been linearized by means of the above-described method. In addition or as an alternative, however, the linearized curves could also have been entered into the sequence controller via the input unit, and been subsequently stored. This would permit retrieving for certain applications a previously linearized curve, for example, in the case of a distance measurement relative to different materials, which brings along each time a different curve shape of the output signal of the component, and which thus requires a different adjustment of the linearization circuit. A readjustment of known distance values would then be no longer needed, since the corresponding output signals of the component would already be known.

As regards yet again a simple development, one could apply the output signal of the component as input value to the linearization circuit by means of the switch, after the curve has been linearized.

To apply the method of the invention, one could use a linearization circuit as defined herein. The circuit has the special advantage that it permits a simple input of reference input values and their associated reference output values into the sequence controller.

With respect to a particularly cost-favorable configuration, the linearization circuit could be constructed as an analog circuit. In comparison with digital components, the use of analog components is a great deal more cost-favorable with the same satisfactory resolution and accuracy as well the same high processing speed.

Within the scope of an especially simple configuration, the sequence controller could comprise a microprocessor, and/or a memory, and/or an input unit, and or an output unit. In a particularly advantageous way, it could be a commercially available computer. As input unit, it would be possible to use not only a keyboard, a mouse, or the like, but also a touch screen. The output unit could simply be a display, or monitor, or the like.

In a particularly advantageous configuration, the memory could be realized as a nonvolatile memory. The use of a nonvolatile memory would permit retaining all adjustments as well as the different input or output values in use for the linearization, even in the event of disconnection or failure of the operating voltage. This would make the circuit especially robust and very universally applicable.

As regards a particularly simple configuration, it would be possible to use a D/A converter for analogizing a reference input value that is output by the sequence controller. This D/A converter could of a high-resolution type, but would not have to be especially robust. Likewise, no special requirements are to be met as regards the amount of the processing speed of the D/A converter. The D/A converter permits determining the reference input values by an iterative comparison in that the sequence controller approximates the reference input value to the actual input value, until a further improvement is no longer possible, i.e., all possible and required bits are set. The corresponding digital value is then stored in the memory and can again be output upon retrieval of the corresponding analog voltage.

Within the scope of a particularly cost-favorable configuration, it would be possible to use at least one adjustable signal source for analogizing a reference input value that is supplied by the sequence controller. This would make it possible to replace the high-resolution and thus costlier D/A converter with more cost-favorable components.

In a particularly simple configuration, the adjustable signal sources could comprise at least one source of reference signals and/or at least one, preferably digitally activatable potentiometer. As above described, this would again permit an A/D conversion of the output signal of the component, namely in that the output signal, which corresponds to the actual input value and the input value of the linearization circuit, is applied to the input of a comparing component, for example a comparator. Applied to the other input of the comparing component would be the output signal of the adjustable signal source, which corresponds to the reference input value. If more than one digitally activatable potentiometer are provided, a summator could add the output voltages of the potentiometers. The output signal of this summator will then correspond to the reference input value and be applied to the other input of the comparator. The evaluation of the output signal of the comparing component would permit an adjustment of the composite voltage by setting the potentiometers by means of the sequence controller. The digital value that corresponds to the actual input value could be stored in the memory, and the corresponding analog voltage could again be output, when needed. This would enable an A/D conversion of the actual input value that is present in analog form.

As regards a particularly simple linearization, adjusting devices could be arranged for adjusting the linearization circuit. The activation of the adjusting devices could occur in a simple manner by means of the sequence controller.

Within the scope of yet again a particularly cost-favorable configuration, the adjusting devices could comprise at least one, in particular digitally activatable potentiometer. In a very advantageous manner, the adjusting devices could comprise at least one digitally activatable potentiometer for adjusting the zero point, and/or at least one digitally activatable potentiometer for adjusting the linearity, and or one digitally activatable potentiometer, and/or one amplifier for adjusting the slope of the linearized curve.

For adjusting a reference output value as supplied by the sequence controller with the actual output value of the linearization circuit, a D/A converter could be used for changing the reference output value to analog form. However, for adjusting a reference output value with the actual output value of the linearization circuit, it would also be possible to adjust in the alternative the reference output value by means of fixed reference signal sources. In particular, it would be possible to provide three sources of fixed reference signals, which can be selectively output via a switch that is activatable by means of the sequence controller.

Within the scope of a particularly simple linearization, the reference output value produced by the sequence controller could be adjusted with the actual output value of the linearization circuit by means of a comparing component, preferably a comparator. The output signal of the comparator could then be also evaluated by the sequence controller, and based on the output signal it would be possible to adjust the digital potentiometers in accordance with the above-described method of adjusting the linearization circuit.

In a particularly advantageous manner, a switch could be arranged, in particular a changeover switch, or multiplexer, or the like for selectively applying the reference output value produced by the sequence controller, and the output signal supplied by the component. In this case, the output signal produced by the component corresponds to the actual input value.

There exist various possibilities of improving and further developing the teaching of the present invention in an advantageous manner. To this end, one may refer to the following description of preferred embodiments of a method according to the invention and a circuit according to the invention for linearizing nonlinear curves with reference to the drawing. In conjunction with the description of preferred embodiments of the method and circuit according to the invention with reference to the drawing, also generally preferred improvements and further development of the teaching are explained.

DETAILED DESCRIPTION OF THE PREFERRED EMBODIMENTS

Figure 1:
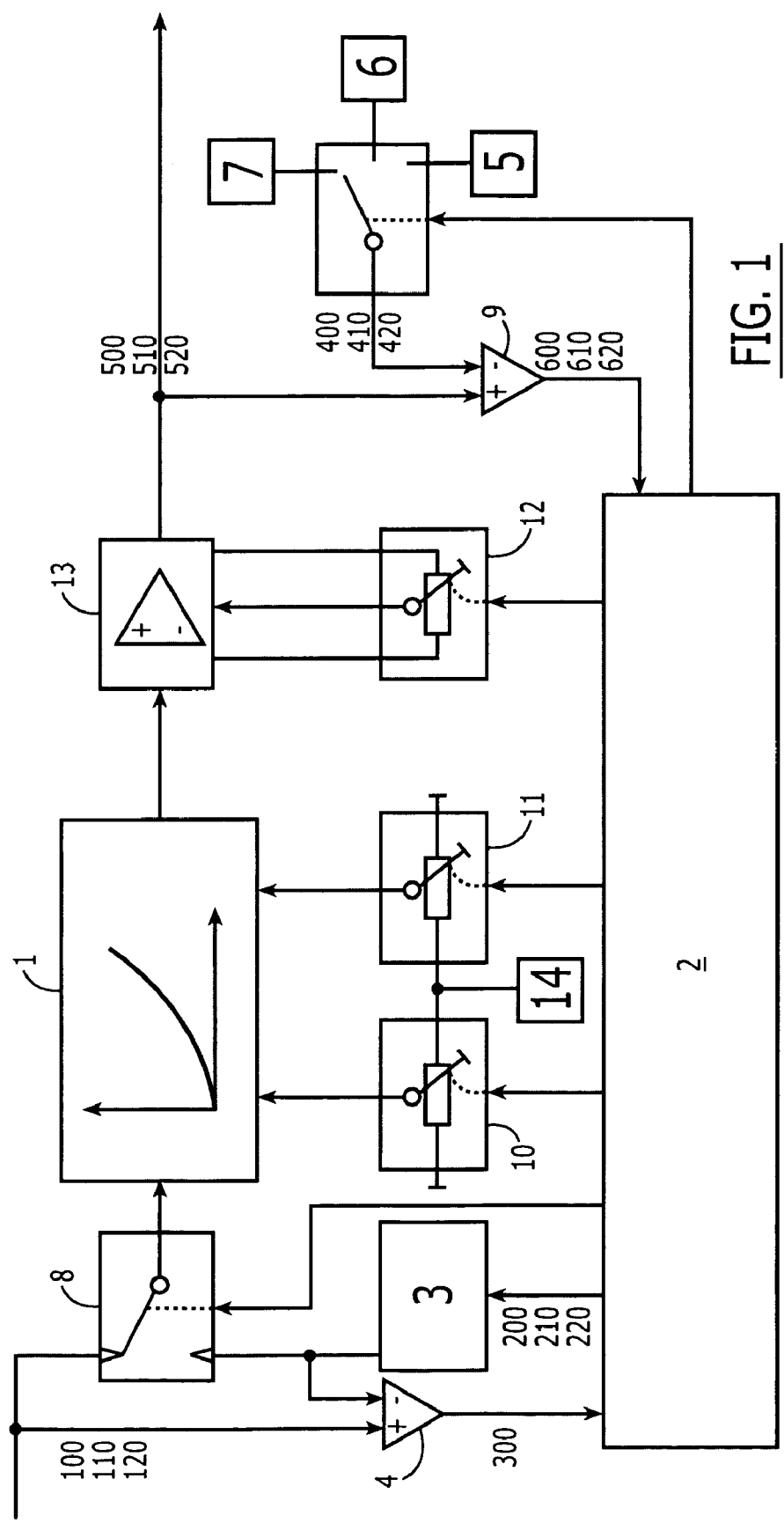
FIG. 1 is a schematic view of an embodiment of a circuit according to the invention for linearizing nonlinear curves for use with a method of the invention.

Illustrated in FIG. 1 is a circuit or circuit arrangement for use with a method for linearizing nonlinear curves with a linearization circuit 1, wherein the curve represents the relationship between an input signal and an output signal of a component in the form of a sensor (not shown). In the present embodiment, the sensor is a displacement sensor, which supplies as output signal an electric voltage that is dependent on a physically measured distance.

In accordance with the invention, the linearization circuit 1 is adjusted by means of a sequence controller 2. The sequence controller 2 acquires three output signals, which correspond to the actual input value 100, 110, and 120 of the linearization circuit. The output signal or the actual input value 100 corresponds to a smallest measuring distance, when the sensor is closest to the object of measurement, the actual input value 110 corresponds to an average measuring distance, and the actual input value 120 corresponds to a maximum distance.

By means of the sequence controller 2 and a D/A converter 3, a reference input value 200 received from the sequence controller 2 is predetermined and analogized. This step is used for digitizing the actual input values 100, 110, 120 in such a manner that the corresponding reference input values 200, 210, 220 are applied, as are the actual input values 100, 110, 120, to a comparing component that is a comparator 4 in the present embodiment, and that an output signal 300 of the comparator 4 is used by the sequence controller 2 to adjust the reference input values 200, 210, 220 by iteration, until a predetermined deviation is undershot between the actual input values 100, 110, 120 and the reference input values 200, 210, 220. In this connection, the reference input values 200, 210, 220 correspond to the starting point, the midpoint, and the end point of the linearized curve. The digital values corresponding to the respective actual input values 100, 110, 120 are stored in a memory in the sequence controller 2, and when being retrieved, the corresponding analog voltage can again be supplied. This allows to achieve a particularly simple A/D conversion of the actual input values 100, 110, 120, and thus of the output signal of the sensor.

In addition to the actual input values 100, 110, 120, the sequence controller 2 acquires and stores reference output values 400, 410, 420. In the embodiment of FIG. 1, these reference output values 400, 410, 420 are adjusted by means of three sources of reference signals 5, 6, 7. These sources of reference signals 5, 6, 7 supply three constant reference voltages, namely 0 volt, 5 volts, and 10 volts.

For adjusting the linearization circuit 1, each of the reference input values 200, 210, 220 as supplied by the sequence controller, are changed to analog form by means of the D/A converter 3. The analogized reference input values 220, 210, 220 produced by the sequence controller are applied via a switch 8 to the input of the linearization circuit 1. The switch 8 is activatable by the sequence controller 2. Subsequently, the linearization circuit 1 supplies actual output values 500, 510, 520.

By means of a comparing component, which is a comparator 9 in the present embodiment, the actual output values 500, 510, 520 that are supplied by the linearization circuit 1 in response to the reference input values 200, 210, 220 are compared with the reference output values 400, 410, 420, with the sequence controller 2 evaluating the output values 600, 610, 620 that are supplied by the comparator 9. Based on the deviation between the actual output values 500, 510, 520 and the reference output values 400, 410, 420, the sequence controller 2 now adjusts adjusting devices 10, 11, 12, 13, which are used to adjust the linearization circuit 1.

In this special embodiment, the adjusting device 10 is used for adjusting the zero point of the linearized curve, and the further adjusting device 11 for adjusting the linearity of the linearized curve, and the adjusting device 12 for adjusting the slope of the linearized curve. The adjusting devices 10, 11, 12 of the present embodiment are digitally activatable potentiometers, which are activated by means of the sequence controller 2. The adjusting device 12 for adjusting the slope of the curve comprises in addition an amplifier 13.

By means of the adjusting devices 10, 11, 12, 13 for each pair of reference input/reference output values 200, 400, 210, 410, 220, 420, the sequence controller 2 adjusts the linearization circuit 1, until a predetermined deviation is undershot between the actual output values 500, 510, 520 and the reference output values 400, 410, 420. To adjust the linearization circuit 1 by means of the adjusting devices 10, 11, 12, 13, a source of reference signals is provided, which is a voltage source 14 in the present embodiment.

Concretely, the reference input value 200, which is adjusted by means of the above-described method to the actual input value 100 and analogized by the D/A converter 3, is applied to the linearization circuit 1 via the switch 8. Essentially at the same time, the corresponding reference output value 400 is applied to the comparator 9. The output signal 600 of the comparator 9 is now evaluated by means of the sequence controller 2, and the potentiometer 10 is adjusted by means of digital pulses from the sequence controller 2 such that the actual output value 500 is essentially equal to the reference output value 400, i.e., the output signal 600 of the comparator 9 falls below a predetermined value for an admissible tolerance. The setting of the potentiometer 10 occurs by iteration.

As soon as the output signal 600 of the comparator 9 falls below a predetermined value, a further reference input value 210 that is supplied by the sequence controller 2 and analogized by the D/A converter 3, is applied to the linearization circuit 1. The reference input value 210 is again adjusted by means of the above-described method to the actual input value 110 and, thus, is essentially equal to the actual input value 110. Essentially at the same time, the associated reference output value 410 produced by the sequence controller 2 is applied to the comparator 9. In addition, the actual output value 510 of the linearization circuit of the additional pair of reference input/reference output values 210, 410 is applied to the comparator 9. The output signal 610 of the comparator 9 is again evaluated by the sequence controller 2.

Based on the evaluation of the output signal 610, the potentiometer 12 in combination with the amplifier 13 for adjusting the slope of the linearized curve is iteratively adjusted by the sequence controller, until the actual output value 510 essentially corresponds to the reference output value 410. Same is acquired by the sequence controller 2 by means of the output signal of the comparator 9.

A further reference input value 220 that is output by the sequence controller 2 and analogized by means of the A/D converter 3, is applied to the linearization circuit 1. Essentially at the same time, the associated reference output value 420 that is output by the sequence controller 2, is applied to the comparator 9. The actual output value 520 that is associated with the further pair of reference input/reference output pair 220, 420, is likewise applied to the comparator 9. The output signal 620 of the comparator 9 is evaluated by the sequence controller 2, and the potentiometer 11 for adjusting the linearity of the curve is accordingly adjusted by iteration, until an admissible tolerance is undershot.

The adjustment of the potentiometers 10, 11, 12 as well as amplifier 13 is repeated for all paired reference input/reference output values 200, 400, 210, 410, 220, 420, until a predetermined deviation between the actual output value 500, 510, 520 and the reference output value 400, 410, 420 is undershot for all reference output values 400, 410, 420.

This linearization procedure is now repeated for different materials of measurement, and the individual, different linearized curves are stored in the sequence controller 2.

At the beginning of the measurement after linearizing the curve, the output signal 100, 110, 120 of the sensor is applied as an input value to the linearization circuit by means of the switch 8 that is controlled by sequence controller 2. A continuous measurement is now possible, with the output signals of the sensor being linearized by means of the linearized curve.

Figure 2:
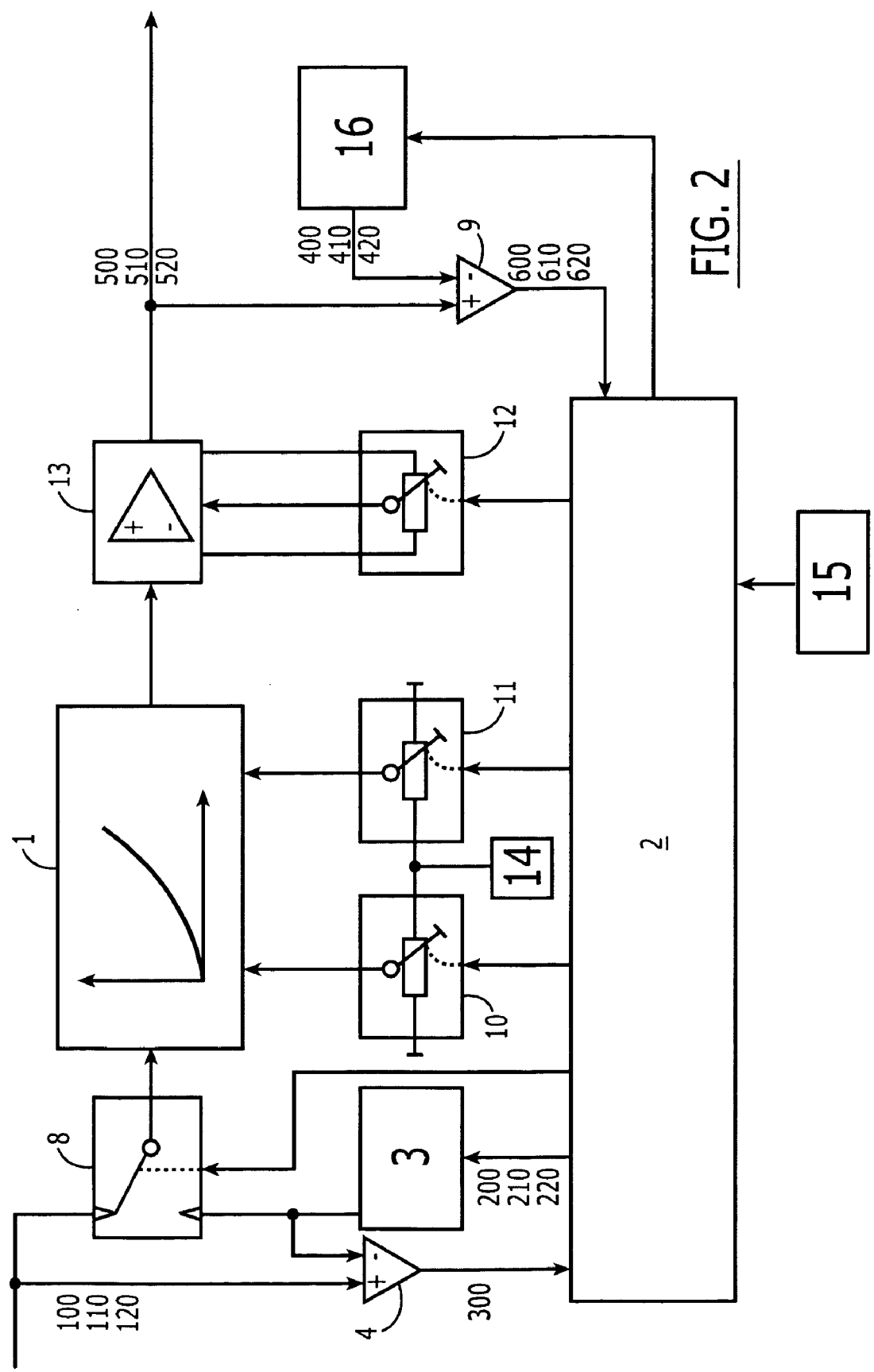
FIG. 2 is a schematic view of a further embodiment of a circuit according to the invention for use with a method of the invention.

FIG. 2 illustrates a further embodiment of a device according to the invention for use with the method of the invention. In this special embodiment, the start of the measuring range, the midpoint of the measuring range, and the end of the measuring range are not accurately adjustable, but can be only approximated. However, the actual values are known, and thus the corresponding reference output values 400, 410, 420 are likewise established. These reference output values 400, 410, 420 are entered via a keyboard 15 into the sequence controller 2. In this process, the reference output values 400, 410, 420 are analogized by means of a D/A converter 16. The D/A converter 16 has a low resolution and accuracy of about 13 to 14 bits. The adjustment of the linearization circuit 1 occurs in the previously described manner.

Figure 3:
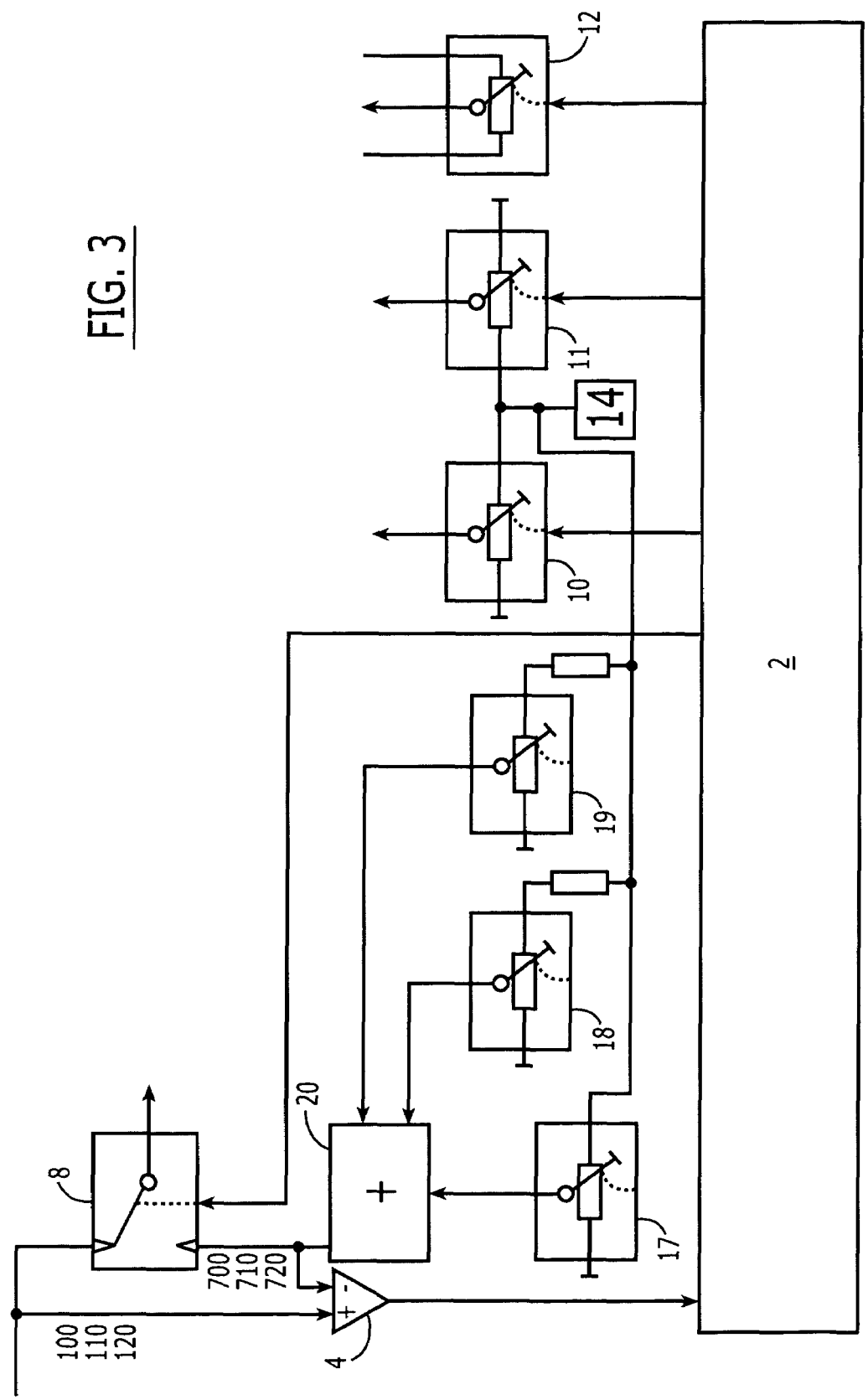
FIG. 3 is a schematic view of a further embodiment showing a portion of the circuit according to the invention for use with a method of the invention.

A further embodiment of a circuit for linearizing curves is shown in FIG. 3. In this special embodiment, the reference input values 200, 210, 220 are changed to analog form by means of adjustable signal sources. The signal sources comprise a reference voltage 14 and three digitally activatable potentiometers 17, 18, 19. The potentiometers 17, 18, 19 are adjustable in equidistant steps by means of the sequence controller 2, and the output signals of the potentiometers 17, 18, 19 are added by means of a summator 20. The change to analog form now occurs in such a manner that the potentiometers 17, 18, 19 are successively adjusted, so that the composite voltage 700, 710, 720 at the output of the summator 20 corresponds to the actual input value 100, 110, 120. The procedure starts with a coarse adjustment by means of potentiometer 17. This is followed by a fine adjustment by means of potentiometer 18, and ends with a sensitive adjustment by means of potentiometer 19.

In this connection, the adjustment range of the potentiometer 18 corresponds to one step of potentiometer 17, and the adjustment range of potentiometer 19 to one step of the adjustment range of potentiometer 18. In this special embodiment, digital potentiometers with 6 bits are provided, i.e. with 64 selectable equidistant steps. Accordingly, the potentiometer 17 supplies a voltage of 0 to 10 volts in 64 steps @ 156.25 mV. The potentiometer 18 supplies a voltage of 0 to 157 mV in 64 steps @ 2.45 mV, and the potentiometer 19 supplies a voltage of 0 to 2.45 mV in 64 steps, i.e., 0.0383 mV. In the case of the given 10-volt range, this corresponds to a resolution of 18 bits, i.e., 1:260,000.

The digital value of the actual input value 100, 110, 120 that is to be stored, results from the individual adjustment of the potentiometers 17, 18, 19, i.e., 3×6 bits. As a result of changing the reference input value to analog form in combination with adjusting the actual input value 100, 110, 120, the actual input value 100, 110, 120 is thus digitized.

As regards further details, the general part of the specification as well as the attached claims are herewith incorporated by reference for purposes of avoiding repetitions.

Finally, it should be expressly noted that the above-described embodiments serve only to explain the claimed teaching, without however limiting it to the specific embodiments which have been disclosed.

The invention claimed is:

1. A method for linearizing a nonlinear curve with an analog linearization circuit with digitally adjustable parameters which are output by a sequence controller, wherein the curve represents the relationship between input signals and output signals of a sensor, and wherein an output signal (100, 110, 120) is respectively associated to each input signal, and comprising flue step of adjusting the analog linearization circuit in an essentially automated way by means of the sequence controller, wherein at least one reference input value (200, 210, 220) is output by the seauence controller and input to the analog linearization circuit, wherein at least one adjusting device is adjusted by means of the sequence controller, and wherein the sequence controller performs an adjustment of the analog linearization circuit by means of the adjusting devices for each pair of reference input/reference output values, until a predetermined deviation is undershot between the actual output value (500, 510, 520) of the analog linearization circuit in response to the reference input value (200, 210, 220) and the reference output values (400, 410, 420).

2. The method of claim 1, wherein at least one output signal (100, 110, 120), which corresponds to an actual input value of the linearization circuit, is acquired and/or stored by means of the sequence controller.

3. The method of claim 2, wherein at least one reference output value (400, 410, 420) associated with an actual input value (100, 110, 120) is acquired and/or stored by means of the sequence controller.

4. The method of claim 3, wherein the at least one reference output value (400, 410, 420) is adjusted by means of reference sources.

5. The method of claim 1, wherein at least one reference input value (200, 210, 220) is entered into the sequence controller via an input unit.

6. The method of claim 5, wherein the reference input value (200, 210, 220) is in analog form.

7. The method of claim 6, wherein the reference input value (200, 210, 220) is put into the analog form by means of a D/A converter.

8. The method of claim 5, wherein the actual input values (110, 110, 120) and/or the reference input values (200, 210, 220) are applied to a comparator.

9. The method of claim 8, wherein the reference input values (200, 210, 220) are compared with the actual input values (100, 110, 120) by means of the comparator.

10. The method of claim 5, wherein the reference input values (200, 210, 220) are selected as starting point (200), and/or midpoint (210), and/or end point (220) of the linearized curve.

11. The method of claim 5, wherein the reference input values (200, 210, 220) are selected from a subrange of input signals of the nonlinear curve.

12. The method of claim 5, wherein the reference input values (200, 210, 220) produced by the sequence controller are applied to the input of the linearization circuit via a switch.

13. The method of claim 5, wherein the reference input values (200, 210, 220) are put into analog form by means of the D/A converter.

14. The method of claim 1, wherein the adjustment of the adjusting devices is repeated for the paired reference input/reference output values, until a predetermined deviation between the actual output value (500, 510, 520) and the reference output value (400, 410, 420) is undershot for all reference output values (400, 410, 420).

15. The method of claim 1, wherein different linearized curves are stored in the sequence controller.

16. The method of claim 1, wherein after linearizing the curve, the output signal (100, 110, 120) of the sensor is applied as an input value to the linearization circuit by means of a switch.

17. A method for linearizing a nonlinear curve with an analog linearization circuit with digitally adjustable parameters which are output by a sequence controller, wherein the curve represents the relationship between input signals and output signals of a sensor, and wherein an output signal (100, 110, 120) is respectively associated to each input signal, and comprising the step of adjusting the analog linearization circuit in an essentially automated way by means of the sequence controller.

wherein at least one reference input value (200, 210, 220) is entered into the sequence controller via an input unit.

wherein the reference input value (200, 210, 220) is in analog form, and wherein the reference input value (200, 210, 220) is put into the analog form by at least one adjustable source of signals.

18. The method of claim 17, wherein the source of signals is formed by at least one reference voltage and/or at least one digitally activatable potentiometer.

19. The method of claim 18, wherein the potentiometer is preferably adjusted in equidistant steps by means of the sequence controller.

20. The method of claim 18, wherein the reference input value (200, 210, 220) is adjusted by means of at least three digitally activatable potentiometers.

21. The method of claim 18, wherein the output signals of the potentiometers are added by means of a summator.

22. The method of claim 18, wherein the settings of the potentiometers are stored, in combination with the associated reference input value (200, 210, 220) and/or a reference output value (400, 410, 420).

23. A method for linearizing a nonlinear curve with an analog linearization circuit with digitally adjustable parameters which are output by a sequence controller, wherein the curve represents the relationship between input signals and output signals of a sensor, and wherein an output signal (100, 110, 120) is respectively associated to each input signal, and comprising the step of adjusting the analog linearization circuit in an essentially automated way by means of the sequence controller.

wherein at least one reference input value (200, 210, 220) is entered into the sequence controller via an input unit, and wherein the sequence controller adjusts the reference input values (200, 210, 220) by iteration, until a predetermined deviation is undershot between the actual input value (110, 110, 120) and the reference input value (200, 210, 220).

24. A method of for linearizing a nonlinear curve with an analog linearization circuit with digitally adjustable parameters which are output by a sequence controller, wherein the curve represents the relationship between input signals and output signals of a sensor, and wherein an output signal (100, 110, 120) is respectively associated to each input signal, and comprising the step of adjusting the analog linearization circuit in an essentially automated way by means of the sequence controller.

wherein at least one output signal (100, 110, 120), which corresponds to an actual input value of the linearization circuit is acquired and/or stored by means of the sequence controller, and wherein at least one reference output value (400, 410, 420) associated with an actual input value (100, 110, 120) is entered into the sequence controller via an input unit.

25. The method of claim 24, wherein actual output values (500, 510, 520) as supplied by the linearization circuit in response to the reference input values (200, 210, 220) are compared with the reference output values (400, 410, 420) by means of a comparator.

26. The method of claim 25, wherein the output signal (600, 610, 620) of the comparator is evaluated by the sequence controller.

27. A method for linearizing a nonlinear curve with an analog linearization circuit with digitally adjustable parameters which are output by a sequence controller, wherein the curve represents the relationship between input signals and output signals of a sensor, and wherein an output signal (100, 110, 120) is respectively associated to each input signal, and comprising the step of adjusting the analog linearization circuit in an essentially automated way by means of the sequence controller, wherein at least one output signal (100, 110, 120), which corresponds to an actual input value of the linearization circuit, is acquired and/or stored by means of the sequence controller, wherein at least one reference output value (400, 410, 420) associated with an actual input value (100, 110, 120) is entered into the sequence controller via an input unit, wherein actual output values (500, 510, 520) as supplied by the linearization circuit in response to the reference input values (200, 210, 220) are compared with the reference output values (400, 410, 420) by means of a comparator, wherein the output signal (600, 610, 620) of the comparator is evaluated by the seauence controller, wherein at least one adjusting device is adjusted by means of the sequence controller, and wherein at least one adjusting device is used for adjusting the zero point, and/or the linearity, and/or the slope of the linearized curve.

28. The method of claim 27, wherein the sequence control activates the adjusting devices with digital pulses.

29. The method of claim 27, wherein the adjusting device for adjusting the zero point of the linearized curve is adjusted such that the actual output value (500, 510, 520) is essentially equal to the reference output value (400, 410, 420).

30. A method for linearizing a nonlinear curve with an analog linearization circuit with digitally adjustable parameters which are output by a sequence controller, wherein the curve represents the relationship between input signals and output signals of a sensor, and wherein an output signal (100, 110, 120) is respectively associated to each input signal, and comprising the step of adjusting the analog linearization circuit in an essentially automated way by means of the sequence controller.

wherein at least one cutout signal (100, 110, 120), which corresponds to an actual input value of the linearization circuit is acquired and/or stored by means of the sequence controller, wherein at least one reference output value (400, 410, 420) associated with an actual input value (100, 110, 120) is entered into the sequence controller via an input unit, wherein actual output values (500, 510, 520) as supplied by the linearization circuit in response to the reference input values (200, 210, 220) are compared with the reference output values (400, 410, 420) by means of a comparator.

wherein the output signal (600, 610, 620) of the comparator is evaluated by the sequence controller, wherein at least one adjusting device is adjusted by means of the sequence controller, and wherein a further reference input value (210) produced by the sequence controller is applied to the linearization circuit.

31. The method of claim 30, wherein the associated reference output value (410) produced by the sequence controller is applied to the comparator.

32. The method of claim 30, wherein the actual output value (510) of the linearization circuit of the further pair of reference input/reference output values (210, 410) is applied to the comparator.

33. The method of claim 32, wherein the output signal (610) of the comparator is evaluated by the sequence controller.

34. The method of claim 32, wherein an adjusting device for adjusting the slope of the linearized curve is adjusted in such a manner that the actual output value (510) is essentially equal to the reference output value (410).

35. A method for linearizing a nonlinear curve with an analog linearization circuit with digitally adjustable parameters which are output by a sequence controller, wherein the curve represents the relationship between input signals and output signals of a sensor, and wherein an output signal (100, 110, 120) is respectively associated to each input signal, and comprising the step of adjusting the analog linearization circuit in an essentially automated way by means of the sequence controller, wherein at least one output signal (100, 110, 120), which corresponds to an actual input value of the linearization circuit, is acquired and/or stored by means of the sequence controller, wherein at least one reference output value (400, 410, 420) associated with an actual input value (100, 110, 120) is entered into the sequence controller via an input unit, wherein actual output values (500, 510, 520) as supplied by the linearization circuit in response tote reference input values (200, 210, 220) are compared with the reference output values (400, 410, 420) by means of a comparator, wherein the output signal (600, 610, 620) of the comparator is evaluated by the sequence controller, wherein at least one adjusting device is adjusted by means of the sequence controller, and wherein a further reference input value (220) produced by the sequence controller is applied to the linearization circuit.

36. The method of claim 35, wherein the associated reference output value (420) produced by the sequence controller is applied to the comparator.

37. The method of claim 36, wherein the actual output value (520) of the further pair of reference input/reference output values (220, 420) is applied to the comparator.

38. The method of claim 37, wherein the output signal (620) of the comparator is evaluated by the sequence controller.

39. The method of claim 37, wherein an adjusting device for adjusting the linearity of the curve is adjusted such that the actual output value (520) is essentially equal to the reference output value (420).

* * * * *

UNITED STATES PATENT AND TRADEMARK OFFICE
CERTIFICATE OF CORRECTION

PATENT NO.       : 7,092,833 B2
APPLICATION NO.  : 10/682500
DATED            : August 15, 2006
INVENTOR(S)      : Hrubes et al.

It is certified that error appears in the above-identified patent and that said Letters Patent is hereby corrected as shown below:

<u>Column 11,</u>
Line 60, "flue" should read --the--;
Line 64, "seauence" should read --sequence--.

<u>Column 14,</u>
Line 21, "seauence" should read --sequence--;
Line 27, "control" should read --controller--;
Line 44, "cutout" should read --output--.

<u>Column 16,</u>
Line 2, "tote" should read -- to the--.

Signed and Sealed this

Second Day of January, 2007

JON W. DUDAS
*Director of the United States Patent and Trademark Office*